United States Patent
Duewer et al.

(10) Patent No.: US 11,402,946 B2
(45) Date of Patent: Aug. 2, 2022

(54) MULTI-CHIP SYNCHRONIZATION IN SENSOR APPLICATIONS

(71) Applicant: Cirrus Logic International Semiconductor Ltd., Edinburgh (GB)

(72) Inventors: Bruce E. Duewer, Round Rock, TX (US); Michael A. Kost, Cedar Park, TX (US); Matthew Beardsworth, Austin, TX (US); Tejasvi Das, Austin, TX (US); Siddharth Maru, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 72 days.

(21) Appl. No.: 16/457,489

(22) Filed: Jun. 28, 2019

(65) Prior Publication Data

US 2020/0272301 A1 Aug. 27, 2020

Related U.S. Application Data

(60) Provisional application No. 62/810,787, filed on Feb. 26, 2019.

(51) Int. Cl.
*G06F 3/041* (2006.01)
*H04J 3/06* (2006.01)
(Continued)

(52) U.S. Cl.
CPC .......... *G06F 3/04184* (2019.05); *G06F 3/044* (2013.01); *G06F 3/045* (2013.01); *H04J 3/0635* (2013.01)

(58) Field of Classification Search
CPC ...... G06F 3/04184; G06F 3/045; G06F 3/044; H04J 3/0635
See application file for complete search history.

(56) References Cited

U.S. PATENT DOCUMENTS

| 4,268,822 A | 5/1981 | Olsen |
| 4,888,554 A | 12/1989 | Hyde et al. |

(Continued)

FOREIGN PATENT DOCUMENTS

| CN | 10542884 A1 | 3/2016 |
| CN | 106471708 A | 3/2017 |

(Continued)

OTHER PUBLICATIONS

International Search Report and Written Opinion of the International Searching Authority, International Application No. PCT/US2019/022518, dated May 24, 2019.

(Continued)

*Primary Examiner* — Dady Chery
(74) *Attorney, Agent, or Firm* — Jackson Walker L.L.P.

(57) ABSTRACT

A system may include a plurality of actively-driven inductive sensors and a plurality of control circuits, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits. Each of the plurality of control circuits may further be configured to configure a schedule for controlling time-division multiplexed operation of its respective set of actively-driven inductive sensors and control time-division multiplexed operation of its respective set of actively-driven inductive sensors based on the schedule and the synchronization information in order to minimize interference among the plurality of actively-driven inductive sensors.

21 Claims, 8 Drawing Sheets

(51) Int. Cl.
  *G06F 3/045* (2006.01)
  *G06F 3/044* (2006.01)

(56) References Cited

U.S. PATENT DOCUMENTS

| | | |
|---|---|---|
| 5,286,941 A | 2/1994 | Bel |
| 5,567,920 A | 10/1996 | Watanabe et al. |
| 5,661,269 A | 8/1997 | Fukuzaki et al. |
| 5,898,136 A | 4/1999 | Katsurahira |
| 6,231,520 B1 | 5/2001 | Maezawa |
| 6,380,923 B1 | 4/2002 | Fukumoto et al. |
| 7,173,410 B1 | 2/2007 | Pond |
| 8,144,126 B2 | 3/2012 | Wright |
| 8,384,378 B2 | 2/2013 | Feldkamp et al. |
| 8,421,446 B2 | 4/2013 | Straubinger et al. |
| 8,674,950 B2 | 3/2014 | Olson |
| 8,970,230 B2 | 3/2015 | Narayanasamy et al. |
| 9,164,605 B1 | 10/2015 | Pirogov et al. |
| 9,707,502 B1 | 7/2017 | Bonitas et al. |
| 10,168,855 B2 | 1/2019 | Baughman et al. |
| 10,372,328 B2 | 8/2019 | Zhai |
| 10,571,307 B2 | 2/2020 | Acker |
| 10,624,691 B2 | 4/2020 | Wiender et al. |
| 10,642,435 B2 | 5/2020 | Maru et al. |
| 10,725,549 B2 | 7/2020 | Marijanovic et al. |
| 10,726,715 B2 | 7/2020 | Hwang et al. |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,294,503 B2 | 4/2022 | Westerman |
| 2001/0045941 A1 | 11/2001 | Rosenberg et al. |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2008/0312857 A1 | 12/2008 | Sequine |
| 2009/0008161 A1 | 1/2009 | Jones et al. |
| 2009/0009195 A1 | 1/2009 | Seguine |
| 2009/0058430 A1 | 3/2009 | Zhu |
| 2009/0140728 A1* | 6/2009 | Rollins ............... G01B 7/023 324/207.16 |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0045360 A1 | 2/2010 | Howard et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0225599 A1 | 8/2014 | Hess |
| 2014/0267065 A1 | 9/2014 | Levesque |
| 2015/0022174 A1 | 1/2015 | Nikitin |
| 2015/0077094 A1 | 3/2015 | Baldwin et al. |
| 2015/0084874 A1 | 3/2015 | Cheng et al. |
| 2015/0293695 A1 | 10/2015 | Schonleben et al. |
| 2015/0329199 A1 | 11/2015 | Golborne et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0179243 A1 | 6/2016 | Schwartz |
| 2016/0231874 A1 | 8/2016 | Baughman et al. |
| 2016/0252403 A1 | 9/2016 | Murakami |
| 2016/0305997 A1 | 10/2016 | Wiesbauer et al. |
| 2016/0357296 A1 | 12/2016 | Picciotto et al. |
| 2017/0023429 A1 | 1/2017 | Straeussnigg et al. |
| 2017/0077735 A1 | 3/2017 | Leabman |
| 2017/0093222 A1 | 3/2017 | Joye et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0282715 A1 | 10/2017 | Fung et al. |
| 2017/0322643 A1 | 11/2017 | Eguchi |
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0055448 A1 | 3/2018 | Karakaya et al. |
| 2018/0059793 A1 | 3/2018 | Hajati |
| 2018/0067601 A1 | 3/2018 | Winokur et al. |
| 2018/0088064 A1 | 3/2018 | Potyrailo et al. |
| 2018/0088702 A1 | 3/2018 | Shutzberg et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0195881 A1 | 7/2018 | Acker |
| 2018/0221796 A1 | 8/2018 | Bonitas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0321748 A1 | 11/2018 | Rao et al. |
| 2019/0179146 A1 | 6/2019 | De Nardi |
| 2019/0197218 A1 | 6/2019 | Schwartz |
| 2019/0204929 A1 | 7/2019 | Attar et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0064160 A1 | 2/2020 | Maru et al. |
| 2020/0064952 A1 | 2/2020 | Gupta et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardworth et al. |
| 2021/0064137 A1 | 3/2021 | Wopat et al. |

(56) References Cited

U.S. PATENT DOCUMENTS

| | | |
|---|---|---|
| 2021/0140797 A1 | 5/2021 | Kost et al. |
| 2021/0149538 A1 | 5/2021 | Lapointe et al. |
| 2021/0152174 A1 | 5/2021 | Yancey et al. |

FOREIGN PATENT DOCUMENTS

| | | |
|---|---|---|
| CN | 209069345 U | 7/2019 |
| DE | 4004450 A1 | 8/1991 |
| DE | 102015215330 A1 | 2/2017 |
| DE | 102015215331 A1 | 2/2017 |
| EP | 1697710 B1 | 4/2007 |
| EP | 2682843 A1 | 1/2014 |
| GB | 2394295 A | 4/2004 |
| GB | 2573644 A | 11/2019 |
| JP | 2006246289 A | 9/2006 |
| KR | 20130052059 A1 | 5/2013 |
| WO | 00/33244 A2 | 6/2000 |
| WO | 20061354832 A2 | 12/2006 |
| WO | 2007068283 A1 | 6/2007 |
| WO | 2016032704 A1 | 3/2016 |
| WO | 2021101722 A1 | 5/2021 |
| WO | 2021101723 A1 | 5/2021 |

OTHER PUBLICATIONS

International Search Report and Written Opinion of the International Searching Authority, International Application No. PCT/US2019/022578, dated May 27, 2019.

International Search Report and Written Opinion of the International Searching Authority, International Application No. PCT/US2019/021838, dated May 27, 2019.

International Search Report and Written Opinion of the International Searching Authority, International Application No. PCT/US2019/045554, dated Oct. 17, 2019.

Combined Search and Examination Report, UKIPO, Application No. GB1904250.6, dated Sep. 10, 2019.

Combined Search and Examination Report under Sections 17 and 18(3), UKIPO, Application No. GB2001341.3, dated Jun. 29, 2020.

International Search Report and Written Opinion of the International Searching Authority, International Application No. PCT/US2020/059113, dated Feb. 23, 2021.

International Search Report and Written Opinion of the International Searching Authority, International Application No. PCT/US2020/059101, dated Mar. 9, 2021.

First Office Action, China National Intellectual Property Administration, Application No. 201980022689.9, dated Jun. 2, 2021.

First Office Action, China National Intellectual Property Administration, Application No. 201980022693.5, dated Jul. 8, 2021.

Definition of "control circuit", The New IEEE Standard Dictionary of Electrical and Electronics Terms, 5th Ed., p. 256 (1993).

International Search Report and Written Opinion of the International Searching Authority, International Application No. PCT/US2021/035695, dated Sep. 9, 2021.

Second Office Action, China National Intellectual Property Administration, Application No. 201980022693.5, dated Dec. 14, 2021.

Combined Search and Examination Report under Sections 17 and 18(3), UKIPO, Application No. GB2111666.0, dated Feb. 11, 2022.

Examination Report under Section 18(3), UKIPO, Application No. GB2101804.9, dated Feb. 25, 2022.

International Search Report and Written Opinion of the International Searching Authority, International Application No. PCT/US2022/012721, dated Apr. 26, 2022.

Second Office Action, China National Intellectual Property Administration, Application No. 201980022693.5, dated Apr. 13, 2022.

Examination Report under Section 18(3), UKIPO, Application No. GB2015439.9, dated May 10, 2022.

International Search Report and Written Opinion of the International Searching Authority, International Application No. PCT/US2022/018886, dated Jun. 10, 2022.

* cited by examiner

MULTI-CHIP SYNCHRONIZATION IN SENSOR APPLICATIONS

RELATED APPLICATION

The present disclosure claims priority to U.S. Provisional Patent Application Ser. No. 62/810,787, filed Feb. 26, 2019, which is incorporated by reference herein in its entirety.

The present disclosure relates to U.S. Provisional patent application Ser. No. 16/267,079, filed Feb. 4, 2019, U.S. Provisional Patent Application Ser. No. 62/649,857, filed Mar. 29, 2018, U.S. Provisional Patent Application Ser. No. 62/721,134, filed Aug. 22, 2018, and U.S. Provisional Patent Application Ser. No. 62/740,029, filed Oct. 2, 2018, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size. One type of sensor that may be utilized to detect user interaction with a human-machine interface is a resistive-inductive-capacitive sensor.

In some instances, it may be desired to use multiple sensors. In such instances, it may be beneficial to avoid exciting it by measuring two sensors at the same time. Separating sensor usage in time may provide a number of benefits, including reducing parasitic coupling of noise between sensors and the ability to more evenly distribute power consumption over time, thus reducing a total simultaneous draw of electrical current required in a multiple-sensor system.

It may also be beneficial to avoid the need for an external clock source in a multiple-sensor system as well as minimize the number of electrically-conductive pins needed to operate the multiple-sensor system. Also, to minimize power consumption, an ability to control sensor scan rates using a low-power oscillator with relaxed accuracy and noise requirements may be beneficial.

In applications in which a single processing integrated circuit has sufficient electrical connections to support all sensors within a multiple-sensor system, a local scheduler may be used to time-division multiplex sensor activation and measurement. However, in many applications, the number of sensors may exceed the number of connections available within a single processing integrated circuit. In such an application, in order to realize benefits available to a multiple-sensor system from time-division multiplexing and low-power oscillators, approaches for synchronizing multiple processing integrated circuits for sensors may be desired.

SUMMARY

In accordance with the teachings of the present disclosure, the disadvantages and problems associated with sensing in multiple-sensor applications may be reduced or eliminated.

In accordance with embodiments of the present disclosure, a system may include a plurality of actively-driven inductive sensors and a plurality of control circuits, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits. Each of the plurality of control circuits may further be configured to configure a schedule for controlling time-division multiplexed operation of its respective set of actively-driven inductive sensors and control time-division multiplexed operation of its respective set of actively-driven inductive sensors based on the schedule and the synchronization information in order to minimize interference among the plurality of actively-driven inductive sensors.

In accordance with these and other embodiments of the present disclosure, a method may be provided for use in a system comprising a plurality of actively-driven inductive sensors and a plurality of control circuits, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits. The method may include configuring, by each control circuit of the plurality of control circuits, a schedule for controlling time-division multiplexed operation of its respective set of actively-driven inductive sensors and controlling, by each control circuit of the plurality of control circuits, time-division multiplexed operation of its respective set of actively-driven inductive sensors based on the schedule and the synchronization information in order to minimize interference among the plurality of actively-driven inductive sensors.

In accordance with these and other embodiments of the present disclosure, a host device may include an enclosure, a plurality of actively-driven inductive sensors integral to the enclosure, and a plurality of control circuits integral to the enclosure, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits, and each of the plurality of control circuits Each of the plurality of control circuits may further be configured to configure a schedule for controlling time-division multiplexed operation of its respective set of actively-driven inductive sensors and control time-division multiplexed operation of its respective set of actively-driven inductive sensors based on the schedule and the synchronization information in order to minimize interference among the plurality of actively-driven inductive sensors.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 4A:
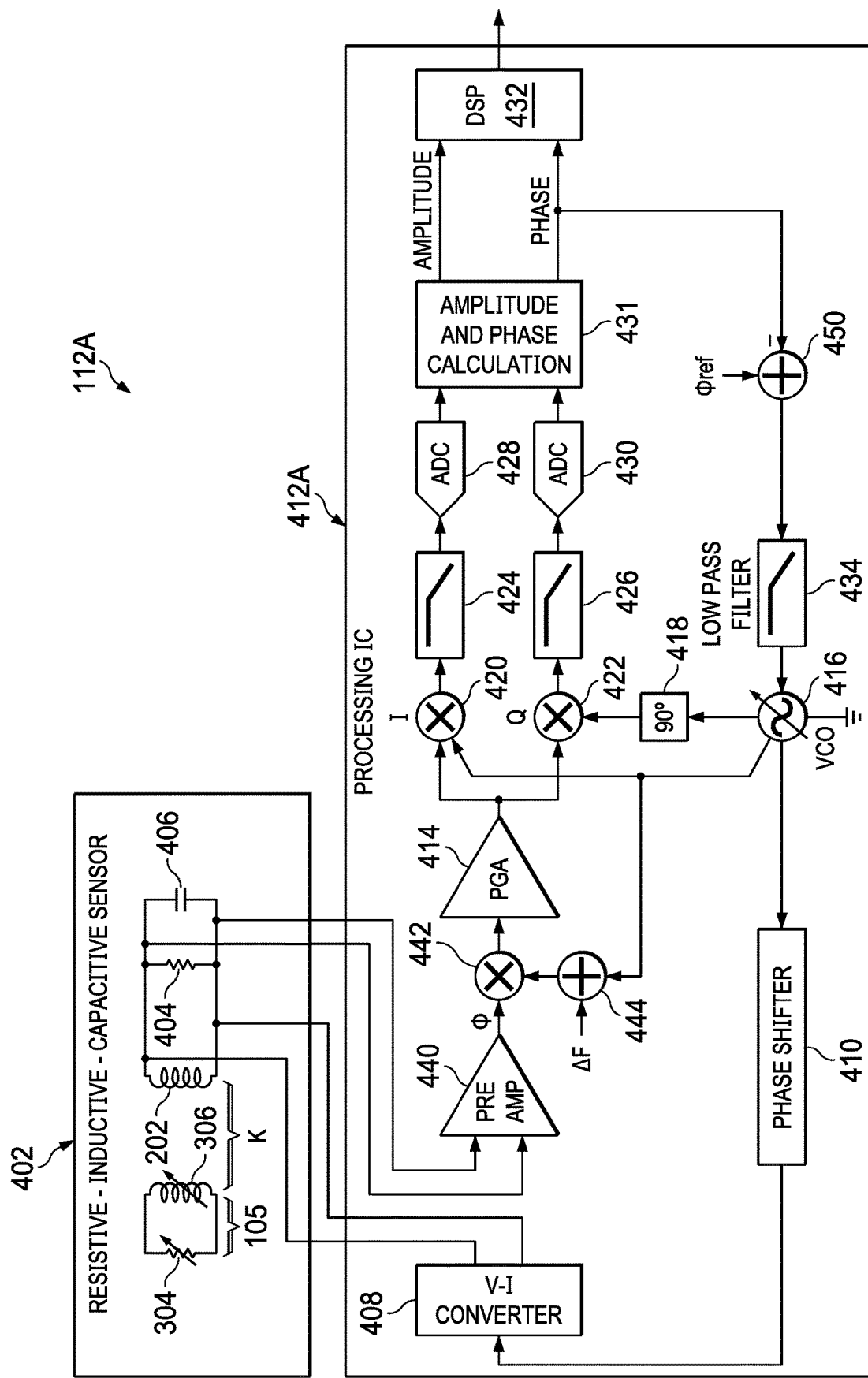
Figure 4B:
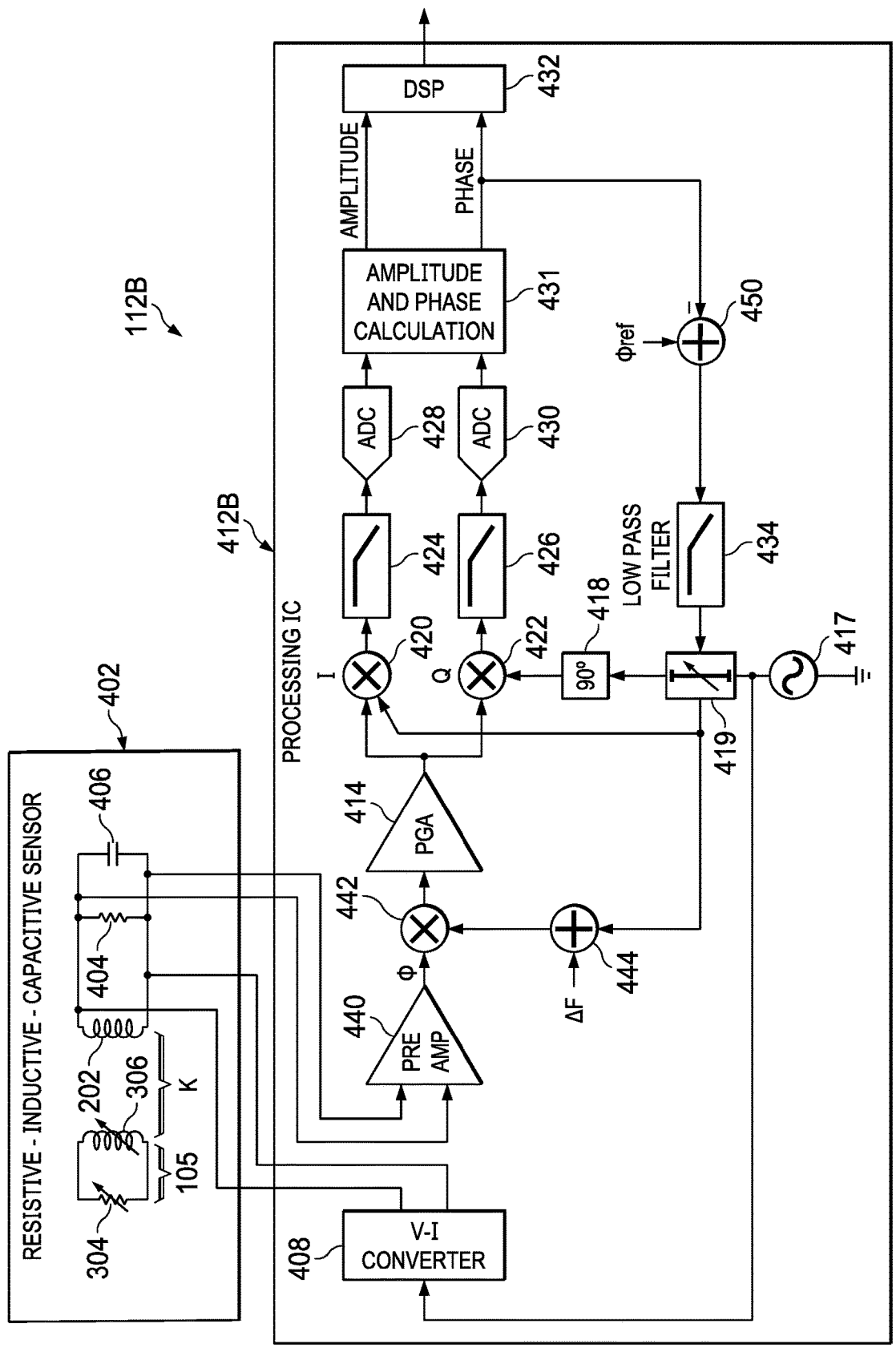
Figure 4C:
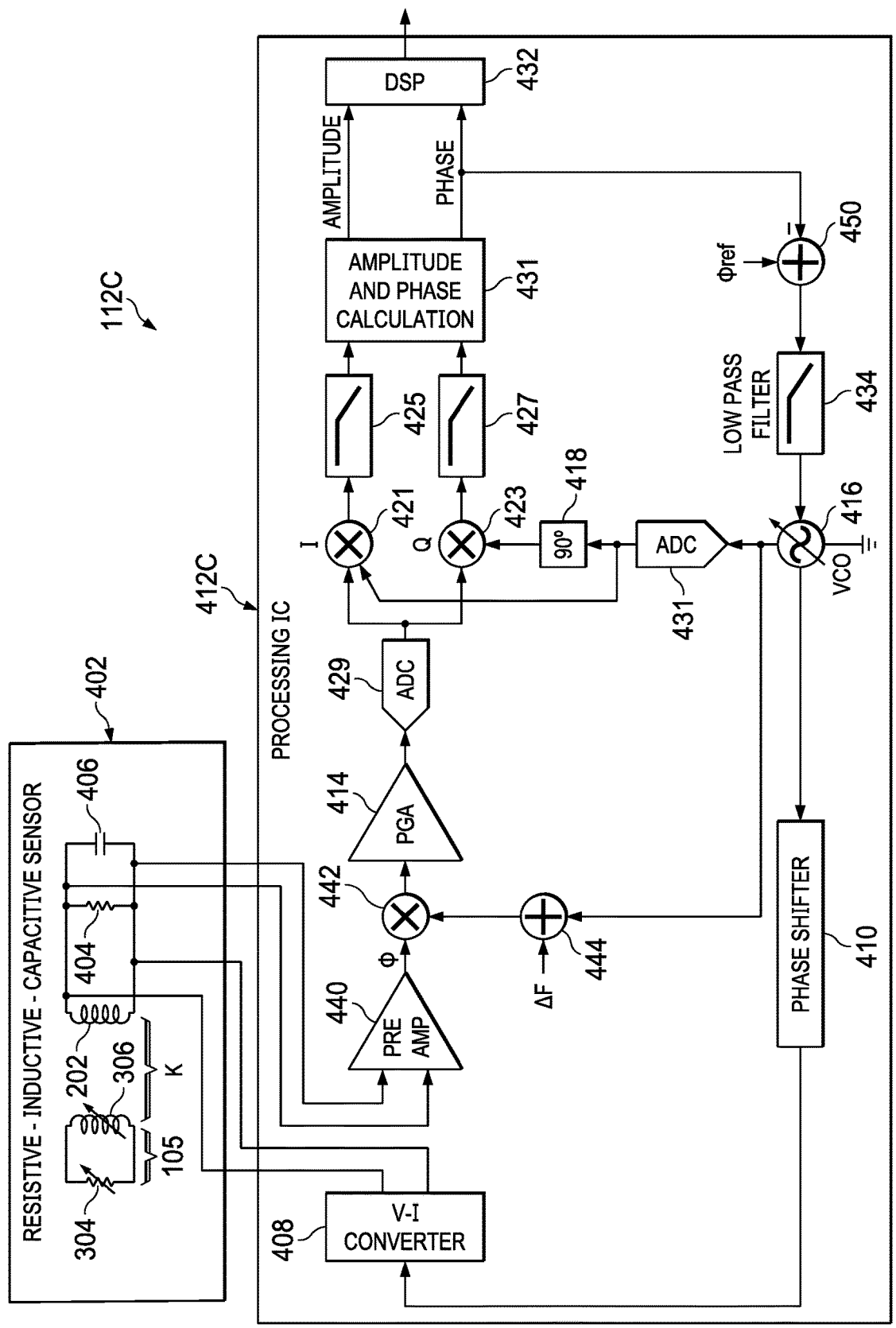
Figure 5:
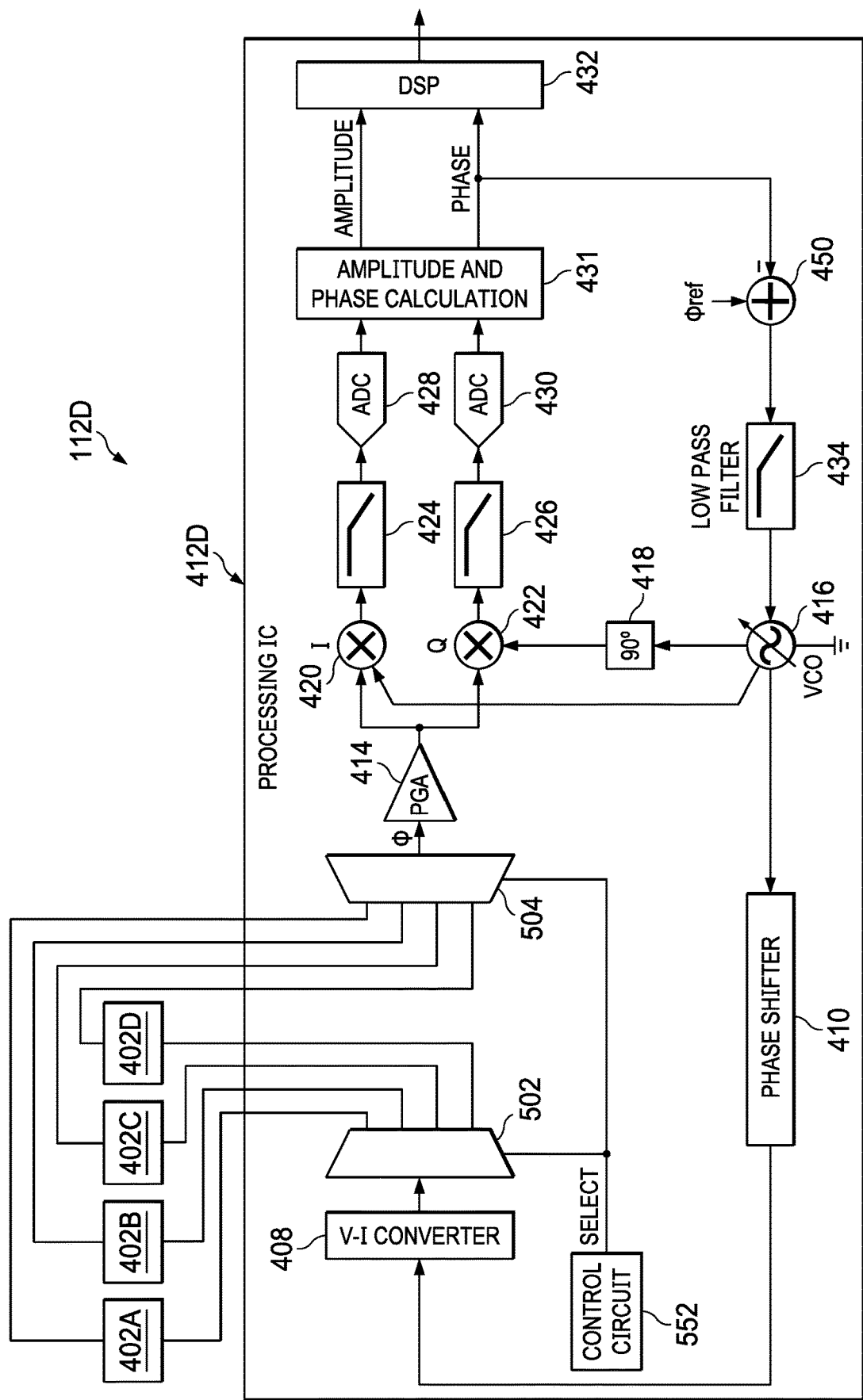
Figure 6:
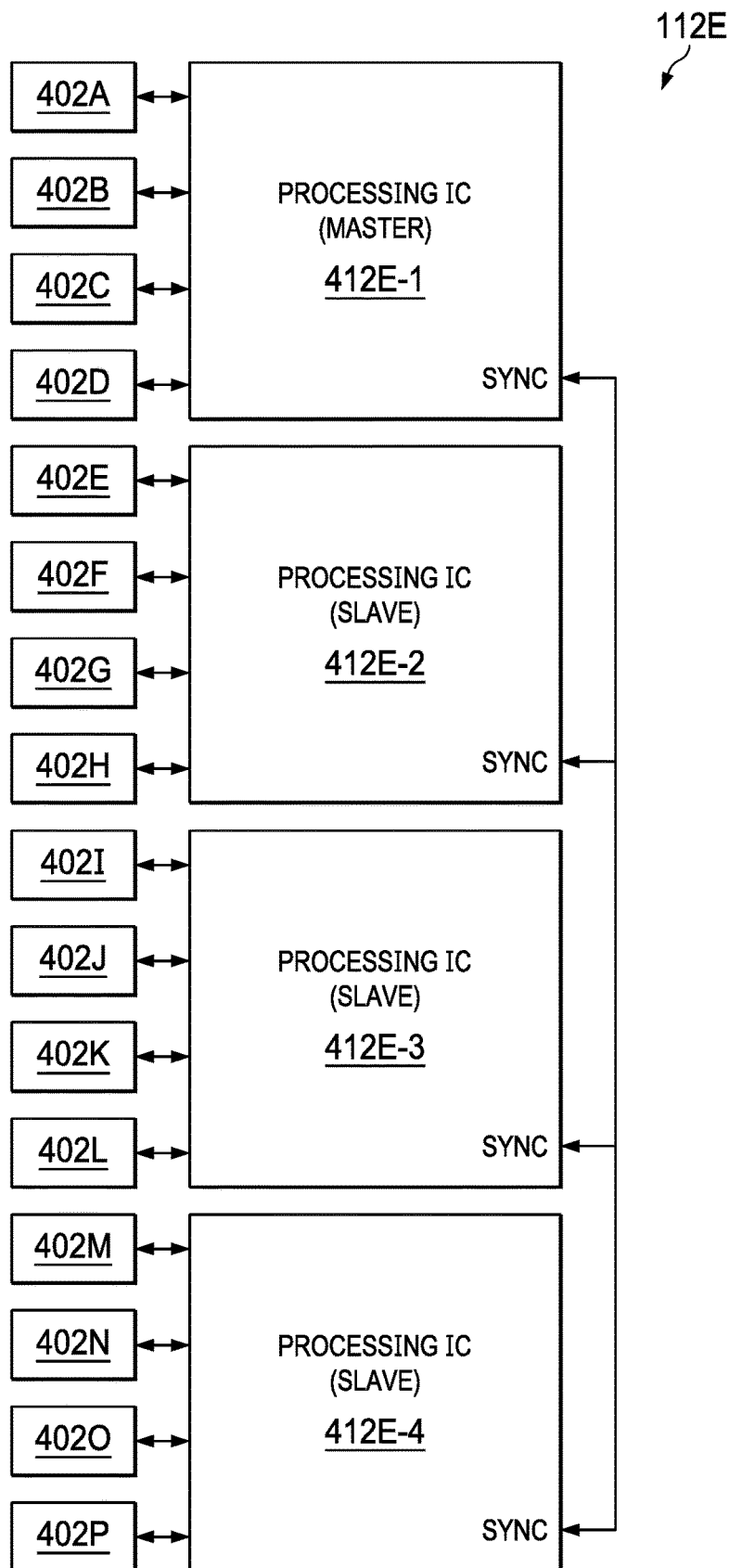
Figure 7:
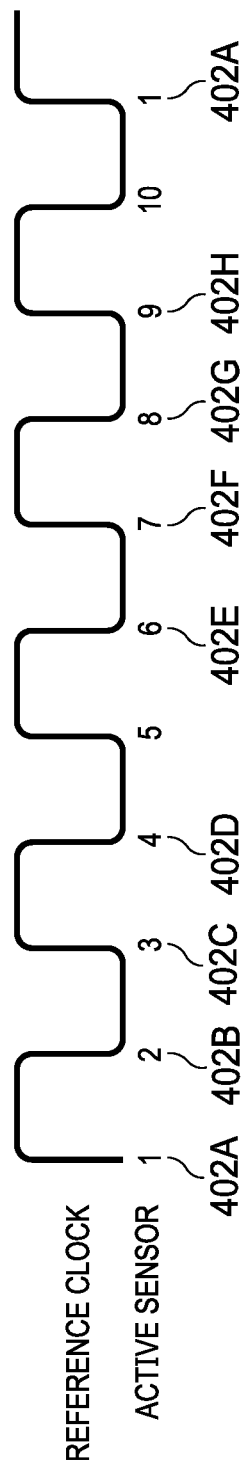
Figure 8:
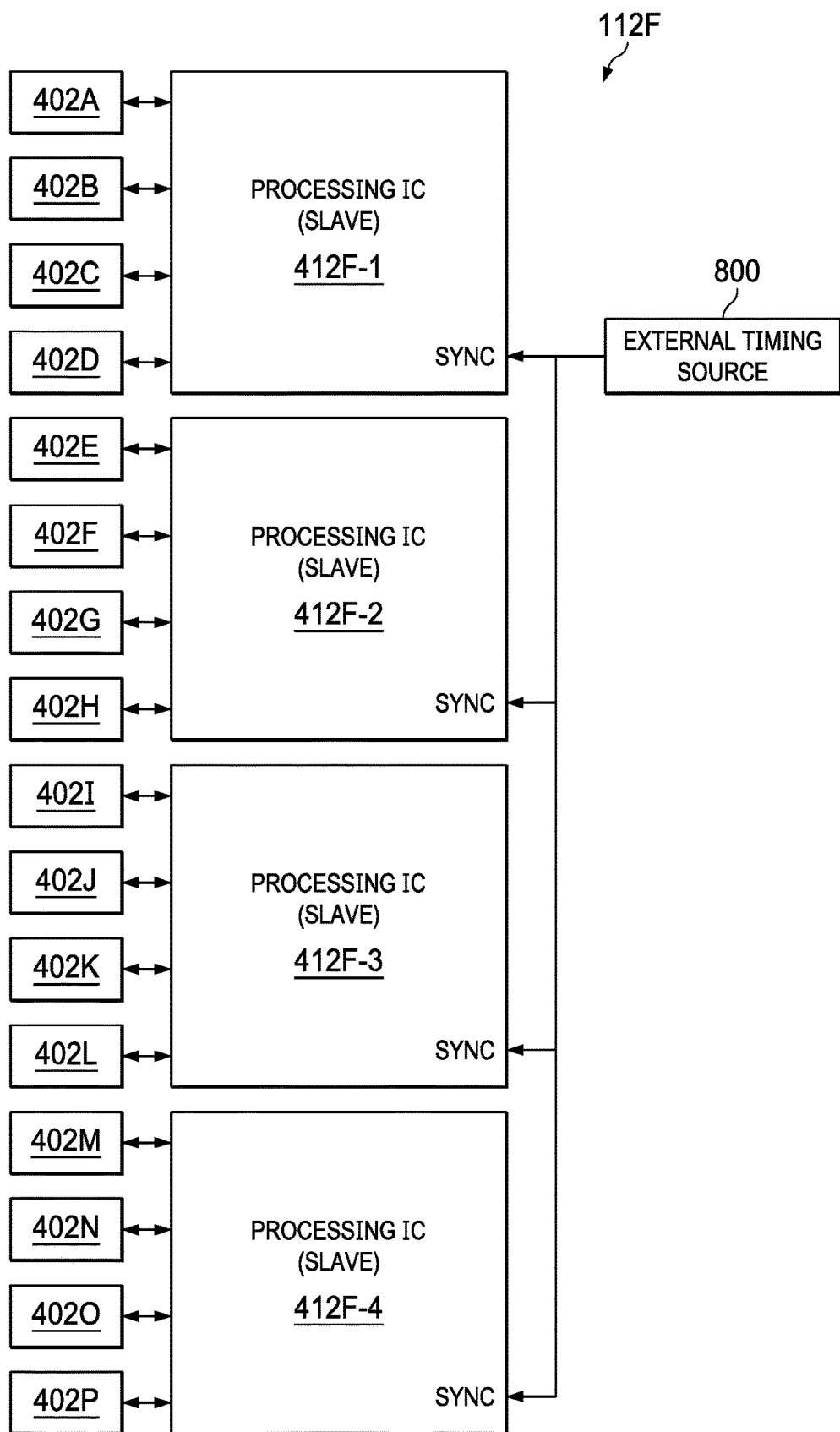

Each of FIGS. 4A-4C illustrates a diagram of selected components of an example resonant phase sensing system, in accordance with embodiments of the present disclosure;

FIG. 5 illustrates a diagram of selected components of an example resonant phase sensing system implementing time-division multiplexed processing of multiple resistive-inductive-capacitive sensors, in accordance with embodiments of the present disclosure;

FIG. 6 illustrates a diagram of selected components of an example resonant phase sensing system implementing time-division multiplexed processing of multiple resistive-inductive-capacitive sensors controlled by multiple processing integrated circuits, in accordance with embodiments of the present disclosure;

FIG. 7 illustrates an example timing diagram of time-division multiplexed processing of multiple resistive-inductive-capacitive sensors controlled by multiple processing integrated circuits, in accordance with embodiments of the present disclosure; and FIG. 8 illustrates a diagram of selected components of another example resonant phase sensing system implementing time-division multiplexed processing of multiple resistive-inductive-capacitive sensors controlled by multiple processing integrated circuits, in accordance with embodiments of the present disclosure.

DETAILED DESCRIPTION

Figure 1:
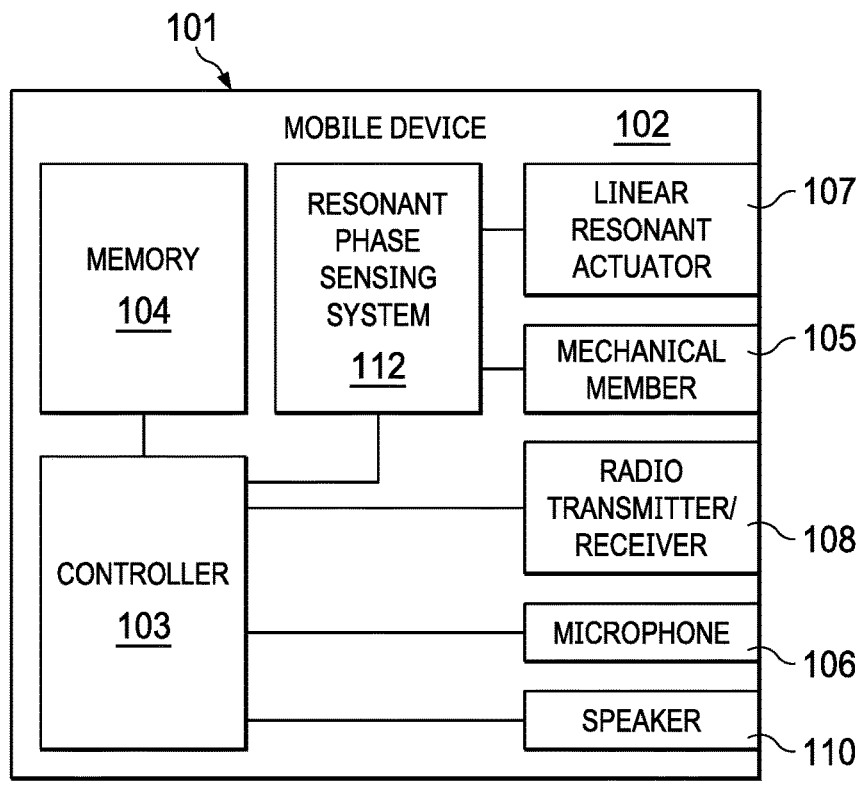
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces, each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot) such as a robot, an audio player, a video player, and a mobile telephone (e.g., a smartphone).

Figure 2:
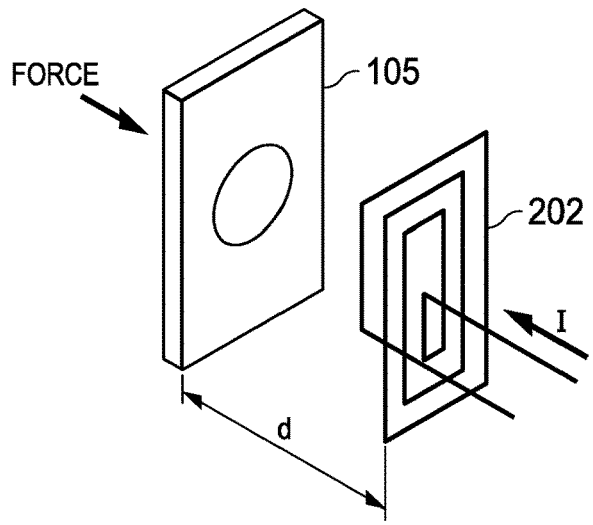
FIG. 2 illustrates a mechanical member separated by a distance from an inductive coil, in accordance with embodiments of the present disclosure.
Figure 3:
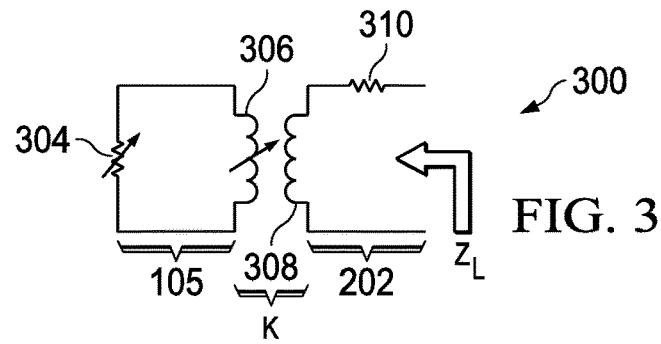
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal ϕ generated by pre-amplifier 440, is approximately equal to a quadrature component of sensor signal ϕ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal ϕ and condition sensor signal ϕ for frequency mixing, with mixer 442, to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal ϕ directly from resistive-inductive-capacitive sensor 402. However, when present, preamplifier 440, mixer 442, and combiner 444 may allow for mixing sensor signal ϕ down to a lower intermediate frequency Δf which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal $\phi$ to condition sensor signal $\phi$ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal $\phi$. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal $\phi$, low-pass filter 424 may filter out the oscillation signal mixed with the amplified sensor signal $\phi$ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal $\phi$, low-pass filter 426 may filter out the phase-shifted oscillation signal mixed with the amplified sensor signal $\phi$ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112A by modifying the driving frequency of VCO 416.

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown in FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal $\phi$ towards indicating a phase shift of zero. As a result, sensor signal $\phi$ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 434 in connection with variable phase shifter 419 may implement a feedback control loop that may track changes in operating parameters of resonant phase sensing system 112B by modifying the phase shift applied by variable phase shifter 419.

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 and ADC 431 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402D shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402D shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT, which may be controlled by time-division multiplexing control circuitry 552.

Although FIG. 5 depicts four resistive-inductive-capacitive sensors 402A-402D for purposes of clarity and exposition, resonant phase sensing system 112D may include any suitable number of resistive-inductive-capacitive sensors 402.

Control circuit 552 may comprise any suitable system, device, or apparatus configured to control time-division multiplexed sensing on one or more resistive-inductive-capacitive sensors 402, as described in greater detail below. Although FIG. 5 shows control circuitry 552 as being integral to processing IC 412D, in some embodiments, control circuitry 552 may be implemented by controller 103 or another suitable component of mobile device 102.

Accordingly, while in some embodiments a device such as mobile device 102 may comprise a plurality of resistive-inductive-capacitive sensors 402 which may be simultaneously driven and separately processed by a respective processing IC, in other embodiments, a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, control circuitry 552 may provide control of control signal SELECT in order to, for a first duration of a scan period, select a first resistive-inductive-capacitive sensor (e.g., resistive-inductive-capacitive sensor 402A) to be driven by voltage-to-current converter 408 and measured by the measurement circuit implemented by processing IC 412D. During such first duration, control circuitry 552 may place other resistive-inductive-capacitive sensors (e.g., resistive-inductive-capacitive sensors 402B, 402C, and 402D) in a low-impedance state. Similarly, during a second duration of the scan period, control circuitry 552 may provide control of control signal SELECT in order to select a second resistive-inductive-capacitive sensor (e.g., resistive-inductive-capacitive sensor 402B) to be driven by voltage-to-current converter 408 and measured by the measurement circuit implemented by processing IC 412D. During such second duration, control circuitry 552 may place other resistive-inductive-capacitive sensors (e.g., resistive-inductive-capacitive sensors 402A, 402C, 402D) in a low-impedance state. A similar process may allow for sensing other resistive-inductive-capacitive sensors in other durations of the scan period. Such an approach may minimize power consumption within unselected resistive-inductive-capacitive sensors 402.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

As described in the Background section above, in some instances, a number of sensors in a multiple-sensor system may exceed the number of connections available within a single processing IC 412. Accordingly, such multiple-sensor systems may include a plurality of processing ICs 412, wherein each processing IC 412 is configured to control a respective set of sensors. Example implementations of such multiple-sensor systems are described below in reference to FIGS. 6 and 7.

FIG. 6 illustrates a diagram of selected components of an example resonant phase sensing system 112E implementing time-division multiplexed processing of multiple resistive-inductive-capacitive sensors 402 controlled by multiple processing integrated circuits 412, in accordance with embodiments of the present disclosure. Example resonant phase sensing system 112E may be used to implement resonant phase sensing system 112 of FIG. 1. As shown in FIG. 6, resonant phase sensing system 112E may include a plurality of processing ICs 412E (e.g., processing ICs 412E-1, 412E-2, 412E-3, and 412E-4), each processing IC 412E communicatively coupled to a respective set of resistive-inductor-capacitive sensors 402, thus enabling each processing IC 412E to control its respective set of resistive-inductor-capacitive sensors 402. For the purposes of clarity and exposition, FIG. 6 depicts resonant phase sensing system 112E having four processing ICs 412E and each processing IC 412E having a respective set of four resistive-inductorcapacitive sensors 402. However, resonant phase sensing system 112E may have any suitable number of processing ICs 412E and each processing IC 412E may have a respective set of any suitable number of resistive-inductor-capacitive sensors 402.

Each processing IC 412E may be implemented using a processing IC 412D disclosed above, as modified to enable multiple IC synchronization as described in greater detail below (and in some cases, as modified to perform measurement in a manner consistent with processing ICs 412B and 412C). To that end, each processing IC 412E may include a synchronization pin SYNC for either generating or receiving a synchronization signal, wherein such synchronization signal serves as a reference time base for all of processing ICs 412E, thus enabling scheduling such that each of resistive-inductor-capacitive sensors 402 of resonant phase sensing system 112E is given a periodic conversion time in which it is activated and sampled, as described in greater detail below. In some embodiments, the conversion times of all resistive-inductor-capacitive sensors 402 of resonant phase sensing system 112E will be non-overlapping. However, in other embodiments, a scan period for scanning all resistive-inductor-capacitive sensors 402 may be insufficient for non-overlapping conversion times, and thus processing ICs 412E may operate to minimize simultaneous operation of sensors having the highest degrees of coupling to one another.

In operation, one of processing ICs 412E (e.g., processing IC 412E-1) of resonant phase sensing system 112E may be selected as a "master" device while all other processing ICs 412E are designated as "slave" devices. Such selection may be made in any suitable manner. For example, in some embodiments, the selection of the master device may be hardcoded such that a single processing IC 412E always acts as the master device. In other embodiments, an election mechanism (e.g., random selection) may be used to select a master device. The processing IC 412E selected as the master device may generate and output to its synchronization pin SYNC a reference clock which is divided relative to its own internal clock to ensure that such reference clock is significantly slower than all of the internal clocks of the various slave processing ICs 412E. In turn, each slave processing IC 412E may receive such reference clock via its respective synchronization pin SYNC.

Each processing IC 412E may be configured to schedule time-division multiplexed operating of its respective set of resistive-inductor-capacitive sensors 402, such schedule relative to a value of a counter internal to such processing IC 412E that counts toggles of the reference clock on synchronization pin SYNC. If all individual counters of processing ICs 412E are stated at the same value, they may remain in synchronization and thus all schedules for operating resistive-inductor-capacitive sensors 402 may be coordinated among processing ICs 412E. On the other hand, if counters are started at various offsets, the relative offsets (modulo the counter size) may remain constant. In some embodiments, conversion times of the various resistive-inductor-capacitive sensors 402 may be arranged to be a divisor of the counter size in order to minimize special handling of counter rollover. The greater the magnitude of division of the internal clock to generate the reference clock while still providing desired schedule granularity for resistive-inductor-capacitive sensors 402, the lesser the power consumption used by resonant phase sensing system 112E may be.

In these and other embodiments, the master processing IC 412E may delay its driving of the reference clock on its synchronization pin SYNC until schedule programming is complete and all processing ICs 412E are enabled in order to provide simpler control of synchronization start up.

Timing operation of resonant phase sensing system 112E is further illustrated in FIG. 7. FIG. 7 illustrates an example timing diagram of time-division multiplexed processing of multiple resistive-inductive-capacitive sensors 402 controlled by multiple processing ICs 412E, in accordance with embodiments of the present disclosure. For the purposes of clarity and exposition, the timing diagram of FIG. 7 assumes the presence within resonant phase sensing system 112E of only two processing ICs 412E (e.g., processing ICs 412E-1 and 412E-2), with processing IC 412E-1 controlling sensors 402A-402D and processing IC 412E-2 controlling sensors 402E-402H. However, the concepts and principles depicted in FIG. 7 and its discussion may be applicable to other numbers and arrangements of processing ICs 412 and sensors 402.

As shown in FIG. 7, master processing IC 412E-1 may generate the reference clock at its synchronization pin SYNC and slave processing IC 412E-2 may receive the reference clock via its synchronization pin SYNC. Each of processing IC 412E-1 and 412E-2 may configure a respective schedule and activate its respective sensors and perform measurements of its respective sensors based on such schedule and the reference clock. For example, as shown in FIG. 7, processing IC 412E-1 may configure its respective schedule such that: (a) it activates and measures resistive-inductor-capacitive sensor 402A in response to the first edge of the reference clock; (b) it activates and measures resistive-inductor-capacitive sensor 402B in response to the second edge of the reference clock; (c) it activates and measures resistive-inductor-capacitive sensor 402C in response to the third edge of the reference clock; and (d) it activates and measures resistive-inductor-capacitive sensor 402D in response to the fourth edge of the reference clock. In some implementations, it may be beneficial to allocate one or more time periods to a processing IC 412E to support additional sensing activity that may enable adjusting a configuration of processing IC 412E in response to changes in system conditions, calibrating its respective sensors, and/or other operations. Accordingly, processing IC 412E-1 may further configure its respective schedule to include a fifth duration between the fifth and sixth edges of the reference clock to perform such operations. Similarly, as shown in FIG. 7, processing IC 412E-2 may configure its respective schedule such that: (a) it activates and measures resistive-inductor-capacitive sensor 402E in response to the sixth edge of the reference clock; (b) it activates and measures resistive-inductor-capacitive sensor 402F in response to the seventh edge of the reference clock; (c) it activates and measures resistive-inductor-capacitive sensor 402G in response to the eighth edge of the reference clock; (d) it activates and measures resistive-inductor-capacitive sensor 402H in response to the ninth edge of the reference clock; and (e) allocates after the tenth edge of the reference clock a duration for additional sensing activity. In this example, each processing IC 412E may be configured to, after detecting 10 edges of the reference clock, reset a counter for counting edges of the reference clock.

An approach similar to that described above in reference to FIGS. 6 and 7 may also be used which includes many benefits of the approach described above, but which may allow for a lesser dense schedule of measuring sensors. Under such approach, each processing IC 412E may use its own internal oscillator with programmed times after a toggle of the reference clock in order to sequence activity of its respective resistive-inductive-capacitive sensors 402. Such approach allows for minimal amount of activity on synchronization pin SYNC for each processing IC 412E, but may require that the scheduled conversion times have a guard band sufficient to account for variations in clock frequency among individual processing ICs 412E. In cases such as this approach that involve scheduling activation and measurement of resistive-inductive-capacitive sensors 402 using clocks internal to processing ICs 412E, the amount of time scheduled to a conversion time for a sensor should include sufficient time to account for variations in the internal clocks after sensing begins.

In the embodiments represented by resonant phase sensing system 112E, a special symbol may be communicated by the master processing IC 412E via its synchronization pin SYNC in order to provide synchronization in the case of a noisy environment in which bit errors may occasionally occur on the conductive traces coupling synchronization pins SYNC to one another. One example of such a special symbol may include an additional toggle of the reference clock in proximity to the roll-over toggle of the reference clock to indicate that roll-over has been reached and internal counters should be reset. Accordingly, processing ICs 412E may be configured to distinguish this additional toggle of the reference clock from normal synchronization toggles by keeping track of a normal interval between toggles using their internal clocks and treating toggles close in time as the special symbol. Such technique may allow for counters of the processing ICs 412E to align if alignment is lost.

FIG. 8 illustrates a diagram of selected components of an example resonant phase sensing system 112F implementing time-division multiplexed processing of multiple resistive-inductive-capacitive sensors 402 controlled by multiple processing integrated circuits 412F, in accordance with embodiments of the present disclosure. Example resonant phase sensing system 112F may be used to implement resonant phase sensing system 112 of FIG. 1. As shown in FIG. 8, resonant phase sensing system 112F may include a plurality of processing ICs 412F (e.g., processing ICs 412F-1, 412F-2, 412F-3, and 412F-4), each processing IC 412F communicatively coupled to a respective set of resistive-inductor-capacitive sensors 402, thus enabling each processing IC 412F to control its respective set of resistive-inductor-capacitive sensors 402. For the purposes of clarity and exposition, FIG. 8 depicts resonant phase sensing system 112F having four processing ICs 412F and each processing IC 412F having a respective set of four resistive-inductor-capacitive sensors 402. However, resonant phase sensing system 112F may have any suitable number of processing ICs 412F and each processing IC 412F may have a respective set with any suitable number of resistive-inductor-capacitive sensors 402.

Resonant phase sensing system 112F of FIG. 8 may be, in many respects, similar to resonant phase sensing system 112E of FIG. 6. Accordingly, only certain differences between resonant phase sensing system 112F and resonance phase sensing system 112E may be described herein. One main difference between resonant phase sensing system 112F and resonance phase sensing system 112E is that in lieu of a processing IC 412F generating the reference clock, an external timing source 800 may be present to generate the reference clock, and each processing IC 412F may receive the reference clock from external timing source 800. Thus, in some sense, using the vernacular used in discussing resonant phase sensing system 112E of FIG. 6, in FIG. 8, each processing IC 412F may operate as a slave device and external timing source 800 may comprise the master device.

In order to properly achieve synchronization in resonant phase sensing system 112F, it may be desirable to either: (a) control the start time of external timing source 800 to after schedule configuration by processing ICs 412F; or (b) provide a mechanism for notifying all processing ICs 412F to initiate their respective counters at the same time. Such a mechanism may include monitoring of another input/output signal by processing ICs 412F or use of an input/output write to an address that all processing ICs monitor.

Although the approaches discussed above discuss implementations in which conversion times allocated to each processing IC 412E/412F are equal, the methods and systems described above may be modified slightly to support scenarios in which the number of conversion times allocated to each processing IC 412E/412F are not equal, as well as non-uniform sensor conversion times and other activity intervals, as long as counter rollover is some factor of a common multiple of such activity interval.

Although the foregoing discusses systems and methods for time-division multiplexing of resistive-inductive-capacitive sensors controlled by multiple processing ICs, the teaching herein may be applied generally to time-division multiplexed activation and sensing of sensors other than resistive-inductive-capacitive sensors, and to activation and communication with devices other than sensors.

Although the foregoing contemplates use of closed-loop feedback for sensing of displacement, the various embodiments represented by FIGS. 4A-8 may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified, or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

Although the foregoing contemplates use of a coherent incident/quadrature detector as a phase detector for determining phase information associated with a resistive-inductive-capacitive sensor 402, in some embodiments, changes in a resistive-inductive-capacitive sensor 402 may be measured by operating such resistive-inductive-capacitive sensor 402 as an oscillator and measuring its frequency of oscillation and changes thereto.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a plurality of actively-driven inductive sensors;
   a plurality of control circuits, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits, and each of the plurality of control circuits configured to:
      configure a schedule for controlling time-division multiplexed operation of its respective set of actively-driven inductive sensors; and
      control time-division multiplexed operation of its respective set of actively-driven inductive sensors based on the schedule and the synchronization information in order to minimize interference among the plurality of actively-driven inductive sensors.

2. The system of claim 1, wherein the plurality of actively-driven inductive sensors comprises resistive-inductive-capacitive sensors.

3. The system of claim 1, wherein one of the plurality of control circuits is configured to drive the synchronization information onto the connection.

4. The system of claim 1, further comprising a timing source external to the plurality of control circuits and configured to drive the synchronization information onto the connection.

5. The system of claim 4, wherein the timing source external to the plurality of control circuits is provided by a controller of a host device comprising the plurality of actively-driven inductive sensors and the plurality of control circuits.

6. The system of claim 1, wherein the plurality of control circuits is configured to minimize interference among the plurality of actively-driven inductive sensors by ensuring that no more than one of the plurality of actively-driven inductive sensors is active at a given time.

7. The system of claim 1, wherein the synchronization information includes a symbol for aligning respective counters of the plurality of control circuits.

8. A method comprising, in a system comprising a plurality of actively-driven inductive sensors and a plurality of control circuits, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits:

configuring, by each control circuit of the plurality of control circuits, a schedule for controlling time-division multiplexed operation of its respective set of actively-driven inductive sensors; and controlling, by each control circuit of the plurality of control circuits, time-division multiplexed operation of its respective set of actively-driven inductive sensors based on the schedule and the synchronization information in order to minimize interference among the plurality of actively-driven inductive sensors.

9. The method of claim 8, wherein the plurality of actively-driven inductive sensors comprises resistive-inductive-capacitive sensors.

10. The method of claim 8, further comprising driving, by one of the plurality of control circuits is, the synchronization information onto the connection.

11. The method of claim 8, further comprising driving, by a timing source external to the plurality of control circuits, the synchronization information onto the connection.

12. The method of claim 11, wherein the timing source external to the plurality of control circuits is provided by a controller of a host device comprising the plurality of actively-driven inductive sensors and the plurality of control circuits.

13. The method of claim 8, further comprising minimizing, by the plurality of control circuits, interference among the plurality of actively-driven inductive sensors by ensuring that no more than one of the plurality of actively-driven inductive sensors is active at a given time.

14. The method of claim 8, wherein the synchronization information includes a symbol for aligning respective counters of the plurality of control circuits.

15. A host device comprising:
an enclosure;
a plurality of actively-driven inductive sensors integral to the enclosure;
a plurality of control circuits integral to the enclosure, each control circuit of the plurality of control circuits configured to control operation of a respective set of the actively-driven inductive sensors, each control circuit of the plurality of control circuits communicatively coupled to the other control circuits via a connection configured to distribute synchronization information among the plurality of control circuits, and each of the plurality of control circuits configured to:

configure a schedule for controlling time-division multiplexed operation of its respective set of actively-driven inductive sensors; and control time-division multiplexed operation of its respective set of actively-driven inductive sensors based on the schedule and the synchronization information in order to minimize interference among the plurality of actively-driven inductive sensors.

16. The host device of claim 15, wherein the plurality of actively-driven inductive sensors comprises resistive-inductive-capacitive sensors.

17. The host device of claim 15, wherein one of the plurality of control circuits is configured to drive the synchronization information onto the connection.

18. The host device of claim 15, further comprising a timing source external to the plurality of control circuits and configured to drive the synchronization information onto the connection.

19. The host device of claim 18, wherein the timing source external to the plurality of control circuits is provided by a controller of a host device comprising the plurality of actively-driven inductive sensors and the plurality of control circuits.

20. The host device of claim 15, wherein the plurality of control circuits is configured to minimize interference among the plurality of actively-driven inductive sensors by ensuring that no more than one of the plurality of actively-driven inductive sensors is active at a given time.

21. The host device of claim 15, wherein the synchronization information includes a symbol for aligning respective counters of the plurality of control circuits.

* * * * *

UNITED STATES PATENT AND TRADEMARK OFFICE
CERTIFICATE OF CORRECTION

PATENT NO. : 11,402,946 B2
APPLICATION NO. : 16/457489
DATED : August 2, 2022
INVENTOR(S) : Duewer et al.

It is certified that error appears in the above-identified patent and that said Letters Patent is hereby corrected as shown below:

In the Claims

1. In Column 19, Line 20, in Claim 10, delete "circuits is," and insert -- circuits, --, therefor.

Signed and Sealed this
Twenty-fifth Day of June, 2024

Katherine Kelly Vidal
*Director of the United States Patent and Trademark Office*